United States Patent [19]
Ohno

[11] Patent Number: 5,712,475
[45] Date of Patent: Jan. 27, 1998

[54] LIGHT RECEIVING CIRCUIT WITH VARIABLE THRESHOLD CIRCUIT

[75] Inventor: Hiroshi Ohno, Tokyo, Japan

[73] Assignee: NEC Corporation, Tokyo, Japan

[21] Appl. No.: 554,273

[22] Filed: Nov. 6, 1995

[30] Foreign Application Priority Data

Nov. 4, 1994 [JP] Japan .................. 6-270987

[51] Int. Cl.$^6$ .................................... H01J 40/14
[52] U.S. Cl. .................. 250/214 DC; 250/214 R; 327/72; 327/73
[58] Field of Search .............. 250/214 DC, 214 R, 250/214 A; 327/72, 73, 77, 78, 87, 205

[56] References Cited

U.S. PATENT DOCUMENTS

| | | | |
|---|---|---|---|
| 3,999,060 | 12/1976 | Skagerlund | 250/214 R |
| 4,549,099 | 10/1985 | Yamada et al. | 327/73 |
| 4,679,251 | 7/1987 | Chown | 250/214 A |
| 5,438,289 | 8/1995 | Kan et al. | 327/73 |

FOREIGN PATENT DOCUMENTS

| | | |
|---|---|---|
| 58-169751 | 10/1983 | Japan . |
| 59-148458 | 8/1984 | Japan . |
| 3-35639 | 2/1991 | Japan . |

*Primary Examiner*—Edward P. Westin
*Assistant Examiner*—Kevin Pyo
*Attorney, Agent, or Firm*—Scully, Scott, Murphy & Presser

[57] ABSTRACT

A light receiving circuit provided with an amplifier for amplifying an output signal of a semiconductor light receiving element is disclosed. The amplified electrical signal is first inputted to the inverting input terminal of a comparator. An output voltage of the comparator is divided by resistors connected in series with each other. The difference voltage between the voltage applied to the inverting input terminal and a voltage being present at a connection point between the resistors is divided by means of resistors, and a voltage obtained by this voltage division is then applied to the non-inverting input terminal of the comparator. The amplitude of an output voltage of the comparator is reduced by dividing this output voltage. Moreover, the mean value of this output voltage thereof can be made to be closer to the ground potential. Therefore, when the output of the comparator has a high level, a threshold voltage to be applied to the non-inverting input terminal becomes lower. Consequently, the minimum receiving level of a received optical signal can be lowered.

4 Claims, 3 Drawing Sheets

LIGHT RECEIVING CIRCUIT WITH VARIABLE THRESHOLD CIRCUIT

BACKGROUND OF THE INVENTION

1. Field of the Invention

The present invention generally relates to a light receiving circuit (namely, an optical receiver) for outputting a binary signal according to the intensity of a received optical signal, and more particularly to a light receiving circuit in which a threshold varies according to the intensity of received light.

2. Description of the Related Art

Generally, it is desirable that a threshold value used for binarization of a received optical signal is changed according to the peak value of the intensity of the received optical signal. This is because the power of an optical signal is variable according to the distance, over which an optical signal is transmitted, and the optical output (power) of a device for transmitting light (signals). Further, a circuit for automatically changing a threshold value according to the intensity of a received optical signal is named as an automatic threshold control circuit.

For examples, circuits described in the Laid-open Japanese Utility Model Application No. 58-169751/1983 (hereunder referred to as Literature 1), the Laid-open Japanese Patent Application No. 59-148458/1984 (hereunder referred to as Literature 2) and the Laid-open Japanese Patent Application No. 3-35639/1991 (hereunder referred to as Literature 3) have been known as conventional light receiving circuits in each of which such a threshold varies. Practically, Literature 1 discloses a light receiving circuit in which an output voltage of a light receiving element is first amplified and subsequently, the amplified voltage is divided by two and the peak value of the resultant voltage is held and used as a threshold voltage in a comparator.

Further, Literature 2 discloses a light receiving circuit which uses a predetermined threshold voltage in the case where the peak voltage obtained after the amplification of an output voltage of a light receiving element is not more than a predetermined voltage, and further uses one half of such a peak voltage as the threshold voltage in the case where the peak voltage is not less than the predetermined voltage.

Moreover, Literature 3 discloses a light receiving circuit in which a threshold voltage of a comparator is regulated according to the peak value of the intensity of a received optical signal.

Each of these conventional light receiving circuits can suitably set a threshold voltage according to the reception level of an optical signal. However, these conventional light receiving circuits require a detection circuit for detecting the peak voltage and a holding circuit for holding the peak voltage. Thus each of the conventional light receiving circuits has drawbacks in that the configuration of the circuit becomes complex. In contrast with this, there has been developed a light receiving circuit whose configuration is simplified by using a voltage obtained by dividing the difference between an input voltage, which is proportional to the intensity of an optical signal, and a voltage, which is outputted by a comparator after the binarization thereof, in an appropriate ratio, as a threshold voltage. This conventional light receiving circuit, however, has a drawback in that a minimum receiving level becomes large so as to obtain a predetermined minimum threshold voltage, as will be described later.

SUMMARY OF THE INVENTION

Accordingly, an object of the present invention is to eliminate the aforementioned drawbacks of the conventional circuits and provide a light receiving circuit which can reduces a minimum receiving level by using a simple configuration thereof.

To achieve the foregoing object, in accordance with an aspect of the present invention, there is provided a light receiving circuit which has a light receiving element for outputting a receiving electrical signal proportional to the intensity of a received optical signal. In this light receiving circuit, a comparator compares the received optical signal with a reference signal and further outputs a comparison result. Furthermore, a reference signal varying circuit varies the reference signal according to the level of the received electrical signal. This reference signal varying circuit includes a first voltage dividing circuit for dividing a voltage level represented by the comparison result signal and for outputting a first voltage division signal; and a second voltage dividing circuit for dividing the difference between the first voltage division signal and the received electrical signal and for outputting a second voltage division signal.

More practically, a constant voltage source generates a voltage nearly equal to one of the voltages respectively represented by a high-level signal and a low-level signal, which is closer to a threshold voltage to be set during change in intensity of the optical signal to a peak voltage thereof than the other voltage. Further, a voltage corresponding to the difference between an output voltage of a comparator and an output voltage of the constant voltage source is divided by a first voltage dividing circuit. Further, a voltage corresponding to the difference between a voltage obtained by this voltage dividing circuit and a voltage inputted to an inverting input terminal of the comparator is divided by a second voltage dividing circuit. Moreover, a voltage obtained by the second voltage dividing circuit is inputted to a non-inverting input terminal of the comparator as a threshold voltage. If the potential difference between voltages developed across the first voltage dividing circuit is large, the difference between an output voltage of the comparator and the voltage obtained by this voltage dividing circuit becomes large. Conversely, if the potential difference between voltages developed across the first voltage dividing circuit is small, the difference between an output voltage of the comparator and the voltage obtained by this voltage dividing circuit becomes small. Thus when one of the voltages respectively represented by the high-level signal and the low-level signal, which is closer to the threshold voltage, is outputted from a voltage supply circuit and next, the potential difference between this output voltage of the voltage supply circuit and an output voltage of the comparator is divided, the other of the voltages respectively represented by the high-level signal and the low-level signal can be made to be closer to the threshold voltage. Therefore, the potential difference between a voltage, which is generated by the first voltage dividing circuit when the high-level signal is outputted, and the predetermined threshold voltage can be made to be closer to the potential difference between a voltage, which is generated by the first voltage dividing circuit when the low-level signal is outputted, and the predetermined threshold voltage.

BRIEF DESCRIPTION OF THE DRAWINGS

Other features, objects and advantages of the present invention will become apparent from the following description of a preferred embodiment with reference to the drawings in which like reference characters designate like or corresponding parts throughout several views, and in which.

DETAILED DESCRIPTION OF THE PREFERRED EMBODIMENT

Figure 1:
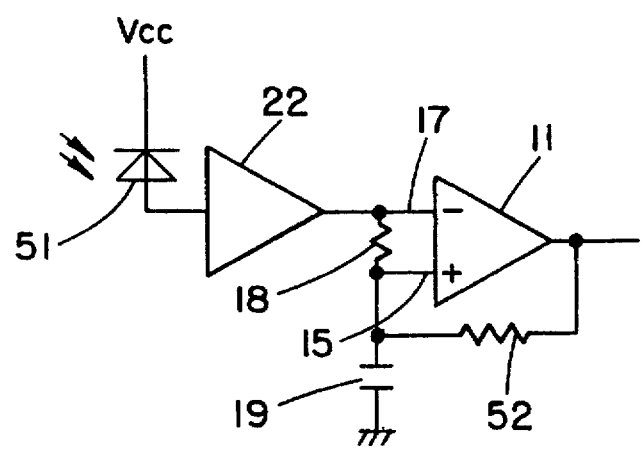
FIG. 1 is a circuit diagram of a conventional light receiving circuit.

For the purpose of facilitating the understanding of the present invention, the conventional light receiving circuit will be first described hereinafter with reference to FIG. 1.

As shown, the cathode of a semiconductor light receiving element or device 51 is connected to a predetermined source voltage, and the anode thereof is connected to an amplifier 22. An output of the amplifier 22 is inputted to the inverting input terminal 17 of a comparator 11. A resistor 18 is connected between the inverting input terminal 17 and the non-inverting input terminal 15 of the comparator 11. An output of the comparator 11 is connected to the non-inverting input terminal 15 thereof through a resistor 52. A capacitor 19 having a grounded terminal is connected to the non-inverting input terminal 15 of the comparator 11.

In the case of this light receiving circuit, a voltage obtained by the logical inversion of an output voltage of the amplifier 22 is outputted from the comparator 11. Further, a voltage obtained by dividing the difference between an output voltage of the comparator 11 and that of the amplifier 22 by means of the resistor 18 and a resistor 52 is applied to the non-inverting input terminal 15. The potential of the non-inverting input terminal 15 is a threshold voltage used for the binarization of the output voltage of the amplifier 22. When the output voltage of the amplifier 22 exceeds the threshold voltage, the output voltage of the comparator 11 is inverted. At that time, time required to invert the output voltage of the comparator 11 is extremely short. In contrast with this, the rise time or the fall time of an optical signal received by the semiconductor light receiving element 51 is not so short. If the threshold voltage applied to the non-inverting input terminal 15 changes in a period time shorter than a time in which the output voltage of the amplifier 22 changes in response to the rise or fall of the optical signal, the output voltage of the comparator 11 is again inverted and thus the binarization can not be correctly achieved. Therefore, the rise and fall of the threshold voltage is delayed by connecting a capacitor 19 to the resistors 18 and 52.

Figure 2:
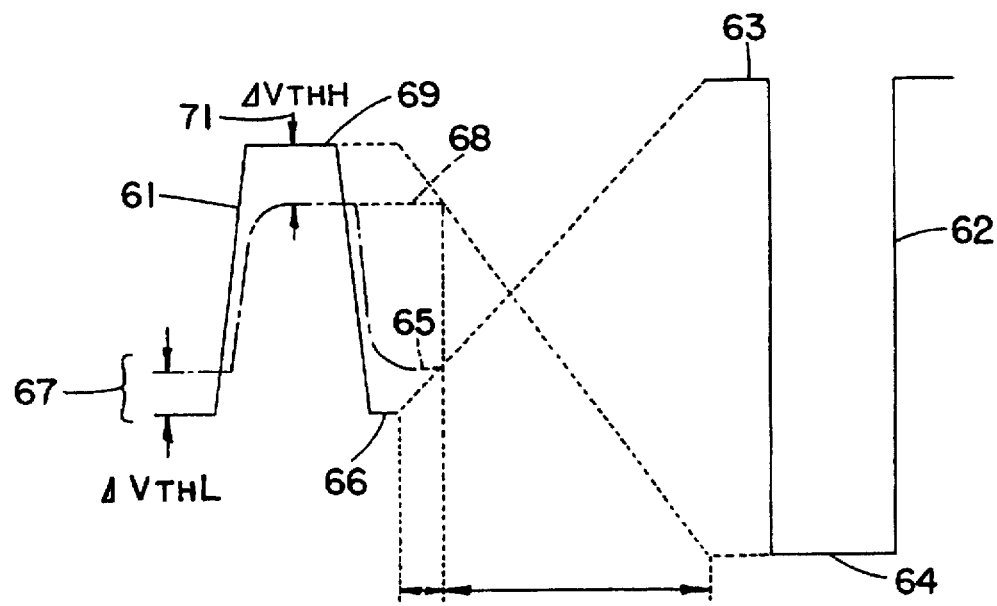
FIG. 2 is a waveform chart for illustrating waveforms of signals flowing through various parts of the conventional light receiving circuit of FIG. 1 when this conventional circuit receives an optical signal having a maximum receiving level.

FIG. 2 illustrates the relation between input and output voltages of the comparator at the maximum receiving level of the optical signal. In this figure, a pulse-like waveform 61 illustrated in the left-side part thereof represents the waveform of an input signal applied to the inverting input terminal 17 according to the level of the received optical signal. A rectangular wave shown in the right-side part of this figure represents the waveform of the output of the comparator 11. Where the optical signal received by the semiconductor light receiving element 51 is used to transmit a digital signal, the intensity of light corresponding to the high-level thereof changes according to the level of the received signal. In contrast, the intensity of light corresponding to the low-level thereof remains constant irrespectively of the level of the received signal. Further, the output of the amplifier 22 of the light receiving circuit is directly connected to the inverting input terminal 17 of the comparator 11 without being intervened by a capacitor. As a result, the peak voltage of an input signal changes according to the intensity of the received optical signal. The minimum voltage level of the input signal, however, remains nearly constant.

The comparator 11 is adapted to output one of a high-level signal 63, which represents a voltage almost equal to the source voltage, and a low-level signal 64 which represents a voltage nearly equal to the ground potential. A threshold voltage 65, which is used when the output of the comparator 11 changes from the high level to the low level, is a voltage obtained by dividing the potential difference between the minimum or lowest voltage 66 of an input signal and the voltage represented by the high-level signal 63 by means of the resistors 18 and 52. At that time, a voltage 67, namely, the difference between the minimum voltage 66 of the input signal and the threshold voltage 65 is $\Delta V_{TH}L$. On the other hand, a threshold voltage 68, which is used when the output voltage of the comparator 11 changes from the low level to the high level, is a voltage obtained by dividing the potential difference between the peak voltage 69 of the input signal and the voltage represented by the low-level signal 64. At that time, a voltage 71, namely, the difference between the peak voltage 69 and the threshold voltage 68 is $\Delta V_{TH}H$. Because the minimum voltage of the input signal remains nearly constant irrespectively of the level of the input signal, the magnitude of $\Delta V_{TH}L$ and the threshold voltage 65 is almost unchanged. In contrast with this, the magnitude of $\Delta V_{TH}H$ and the threshold voltage 68 changes according to the peak voltage 69 of the input signal, namely, depends on the level of the received signal.

Figure 3:
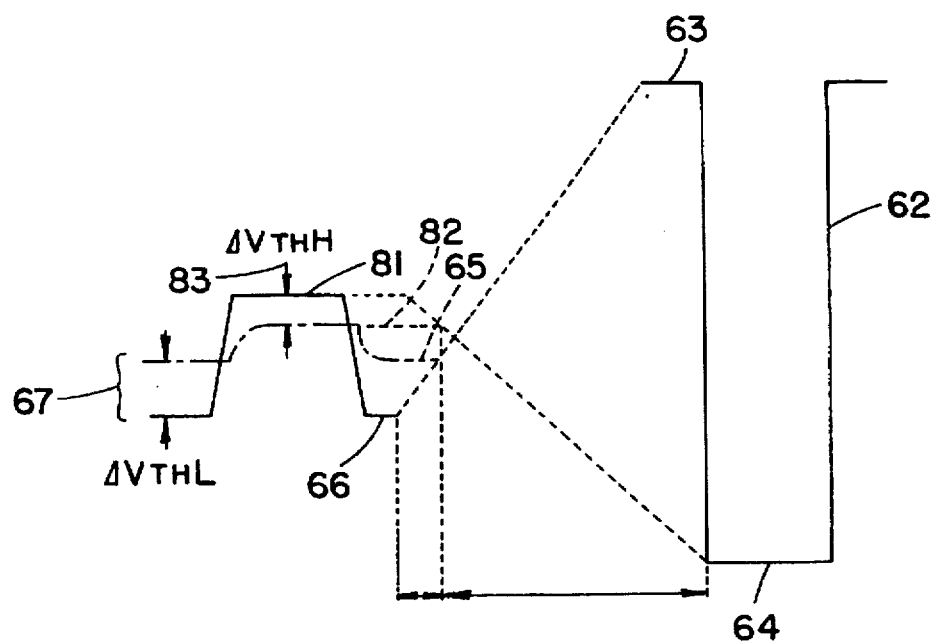
FIG. 3 is a waveform chart for illustrating waveforms of signals flowing through various parts of the conventional light receiving circuit of FIG. 1 when this conventional circuit receives an optical signal having a minimum receiving level.

FIG. 3 illustrates the relation between input and output voltages of the comparator at the minimum receiving level of the optical signal. In this figure, like reference character designates like part of FIG. 2. Even in the case where the optical signal having the minimum receiving level is received, the threshold voltage 65, which is used when the output of the comparator 11 changes from the high level to the low level, and the magnitude of $\Delta V_{TH}L$ are little different from those of FIG. 2 in the case where the optical signal having the maximum receiving level is received. On the other hand, the peak voltage 81 of the input signal decreases according to the level of the received signal. As a result, the threshold voltage 82, which is used when the output of the comparator changes from the low level to the high level, and the magnitude of $\Delta V_{TH}H$ have low values, respectively. Thus, the threshold voltage 65 and the magnitude of $\Delta V_{TH}L$ become constant regardless of the level of the received signal. Therefore, even if the intensity of the received optical signal is low or small, the input voltage of the comparator can exceed this threshold voltage at the time of the rise thereof. Further, the output voltage of the comparator can be inverted. On the other hand, the threshold voltage 82 and the magnitude of $\Delta V_{TH}H$ change according to the peak voltage of the input signal. Consequently, the binarization can be suitably achieved regardless of whether the peak voltage is high or low.

Considering noises generated by the power supply, an input offset (voltage) of the comparator 11, an output offset voltage of the amplifier 22 and a drift in output voltage thereof, each of $\Delta V_{TH}L$ and $\Delta V_{TH}H$ should have the magnitude equal to or more than a certain value. For example, in this case, this value is 50 mV. In the case of the conventional light receiving circuit of FIG. 1, the magnitude of each of $\Delta V_{TH}L$ and $\Delta V_{TH}H$ can be equal to or more than 50 mV if the dividing ratios of the resistors 18 and 52 are suitably set and the level of the received optical signal is equal to or more than a certain level. The minimum voltage 66 of the input signal is fixed. Thus, the threshold voltage 65 obtained by adding 50 mV to this minimum voltage becomes constant. Further, the voltage represented by the high-level signal 63 outputted from the comparator 11 is also constant. Thus the values of the resistance of the resistors 18 and 52 for applying this threshold voltage 65 to the non-inverting input terminal 15 of the comparator 11 are determined. Moreover, the voltage represented by the low-level signal 64 outputted from the comparator 11 is constant. Furthermore, the ratio between the value of the resistance of the resistor 18 and that of the resistance of the resistor 52 is fixed. Thus, the ratio of the peak voltage of the input signal to the peak voltage of the threshold voltage applied to the non-inverting input terminal 15 becomes constant. When the threshold voltage 82, which is used when the output of the comparator 11 changes from the low level to the high level, becomes equal to the threshold voltage 65 used when the output of the comparator 11 changes from the high level to the low level, the receivable peak voltage 81 comes to have the minimum receiving value. Hereunder, the threshold value 65 will be referred to as the minimum threshold voltage. If the minimum threshold voltage 65 has a mean value of the voltage 63 of the high-level signal outputted from the comparator 11 and that of the low-level signal outputted therefrom, the magnitude of $\Delta V_{TH}L$ becomes equal to that of $\Delta V_{TH}H$ in the case where the optical signal having the minimum receiving level is received. Thus the receivable peak voltage 81 can be made to have the minimum value thereof.

However, in the conventional circuit, the minimum threshold voltage can not be set at a value between the value of the voltage level of the high-level signal 63 and that of the voltage level of the low-level signal 64. Thus the binarization of the input signal can not be suitably achieved. It is assumed that the minimum threshold voltage has a value close to the value of the voltage level of the low-level signal, for instance, 1.5 volts (V) or so. At that time, if the ratio between the values of the resistance of the resistor 18 and that of the resistance of the resistor 52 is set at a value in such a manner that the magnitude of $\Delta V_{TH}L$ becomes 50 mV, the peak voltage of the voltage level of the input signal becomes small. When the threshold voltage inputted to the comparator 11 becomes the minimum threshold voltage 65, the magnitude of $\Delta V_{TH}H$ becomes equal to or less than 50 mV. Thus, when a voltage equal to or more than 50 mV is secured as the magnitude of $\Delta V_{TH}H$, the minimum receiving level of the received signal becomes large. Consequently, the binarization of an input signal having a low level comes to be unable to be achieved.

Figure 4:
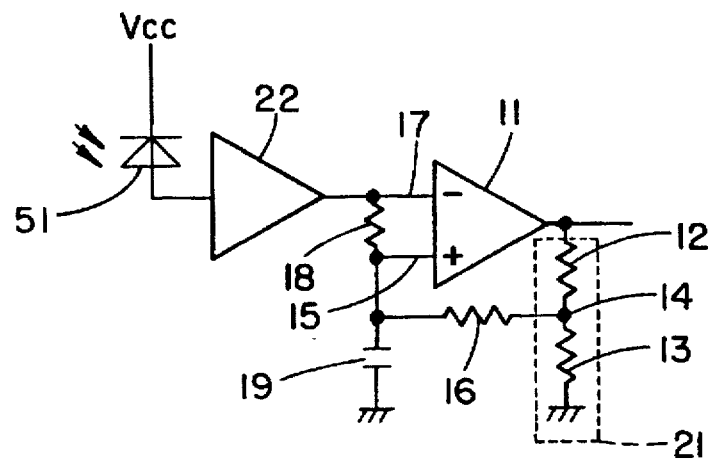
FIG. 4 is a circuit diagram of a light receiving circuit which is an embodiment of the present invention.

FIG. 4 illustrates the configuration of a light receiving circuit which is an embodiment of the present invention. In this figure, same reference character designates a same part of FIG. 1. An output (terminal) of the comparator 11 is grounded through resistors 12 and 13 which are connected in series with each other. A resistor 16 is connected between the connection (point), at which the resistors 12 and 13 are connected, and the non-inverting input terminal of the comparator 11. A resistor 18 is connected between the non-inverting terminal 15 and the inverting input terminal 17 of the comparator 11. The non-inverting input terminal 15 of the comparator 11 is grounded through a capacitor 19. The resistors 12 and 13 constitute a voltage dividing circuit 21. A voltage obtained by dividing the potential difference between a potential, which is obtained by dividing an output voltage of the comparator 11 by means of a voltage dividing circuit 21, and the potential of the inverting input terminal 17 by means of the resistors 18 and 16 is given to the non-inverting input terminal 15 and is used as the threshold voltage of the comparator 11.

An output voltage of the comparator 11 can have one of two values, namely, a high level and a low level. The voltage of the high level is set at, for example, 4.8 V. The voltage of the low level is set at, for instance, 0.3 V. The capacity of the capacitor 19 and the resistance of each of the resistors are set in such a manner that the time constant at each of the rise and fall of the threshold voltage becomes less than the duration of one pulse of the optical signal to be inputted. The capacity of the capacitor 19 and the resistance of each of the resistors are set in such a manner that the rise and fall of the threshold voltage become gentler than the rise and fall of an input signal to be inputted from the inverting input terminal 17 of the comparator 11, respectively. In this case, the transmission rate of information to be transmitted by using an optical signal has a high rate such as 20 Mb/s. Thus, the input capacity and resistance of the comparator 11 significantly affect the transmission rate. Therefore, a capacitor of small capacity, namely, 20 pF is used.

The minimum voltage level of an input signal of the comparator 11 is limited to almost 1.2 V by the offset voltage of the amplifier 22. In the case of securing $\Delta V_{TH}L$ and $\Delta V_{TH}H$, the magnitude of each of which is equal to or more than 50 mV, the value of the resistance of each of the resistors, by which the receivable minimum level of the received signal is minimized, is determined as follows. For simplicity of description, a partial voltage at the connection point 14, which is obtained when the output of the comparator 11 has a low level (namely, 0.3 V), is assumed to be almost "0." At that time, because each of $\Delta V_{TH}L$ and $\Delta V_{TH}H$ has the magnitude equal to or more than 50 mV, the peak voltage in the case of receiving an optical signal having the minimum level becomes equal to 1.3 V obtained by adding 100 mV to 1.2 V. The minimum threshold voltage becomes equal to 1.25 V. Because the ratio between the resistance of the resistor 16 and that of the resistor 18 has a fixed value, the voltage or potential, which is present at the connection point 14 in the case where the output of the comparator 11 has the high level, should be nearly twice the minimum threshold voltage. Therefore, the voltage or potential, which is present at the connection point 14 in the case where the output of the comparator 11 has the high level, should be 2.5 V which is twice the minimum threshold voltage of 1.25 V. The high level of the output voltage of the comparator 11 is approximately 5 V. Thus the ratio between the partial voltage developed across the resistor 12 and that developed across the resistor 13 is set at 1:1. In this case, the resistance of each of these resistors is set at 2 k$\Omega$.

Further, in order to set the magnitude of each of $\Delta V_{TH}L$ and $\Delta V_{TH}H$ at 50 mV in the case where the optical signal having the minimum receiving level is received, the ratio of the partial voltage developed across the resistor 18 to that developed across the resistor 16 should be set at almost 1:25. Namely, the ratio between these partial voltages is set in such a manner that the minimum threshold voltage and $\Delta V_{TH}H$ becomes 1.25 V and 50 mV, respectively, when the potential at the connection point 14 is nearly 0. Similar result can be obtained by setting the ratio between these partial voltages in such a manner that the minimum threshold voltage and $\Delta V_{TH}L$ becomes 1.25 V and 50 mV, respectively, when the potential at the connection point 14 is 2.5 V. In this case, the resistance of the resistor 18 and that of the resistor 16 are set at 1.8 kΩ and 45 kΩ, respectively. Thus, the magnitude of $\Delta V_{TH}L$ can be equal to that of $\Delta V_{TH}H$ in the case of receiving an optical signal having the minimum receiving level, by setting the ratio between the partial voltage developed across the resistor 12 and that developed across the resistor 13 in such a manner that the minimum threshold voltage has a mean value of the voltages which are respectively present in the case where the output of the comparator 11 has the high-level and in the case where the output of the comparator 11 has the low-level. Further, even in the case where an optical signal having the minimum receiving level is received, the binarization can be achieved without an error by setting the ratio between the partial voltage developed across the resistor 16 and that developed across the resistor 18 in such a manner that each of $\Delta V_{TH}L$ and $\Delta V_{TH}H$ has a sufficient magnitude as a margin in such a case.

Figure 5:
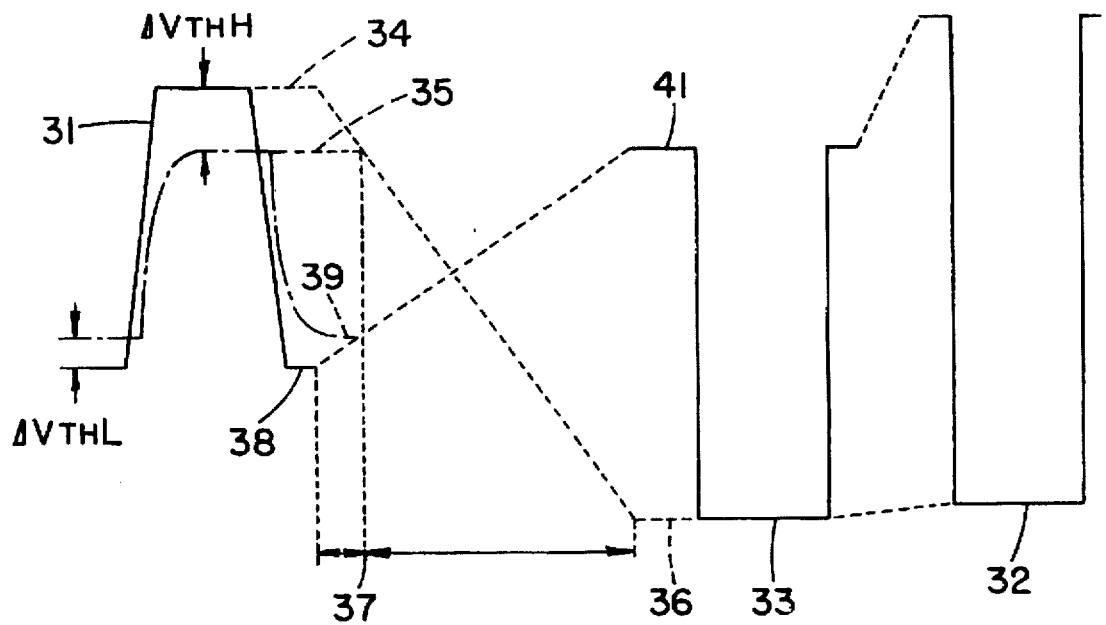
FIG. 5 is a waveform chart for illustrating waveforms of signals flowing through various parts of the light receiving circuit of FIG. 4 when this circuit receives an optical signal having a maximum receiving level.

FIG. 5 illustrates waveforms of signals flowing through various parts of this light receiving circuit when this circuit receives an optical signal having the maximum receiving level. In this figure, a pulse-like waveform 31 illustrated in the left-side part thereof represents the waveform of an input signal applied to the inverting input terminal of the comparator 11. A rectangular wave shown in the right-side part of this figure represents the waveform of the output voltage signal of the comparator 11. The second rectangular wave from the right represents the waveform of a voltage signal which is present at the connection point between the resistors 12 and 13. When the input signal represents a peak voltage 34, a threshold voltage 35 is a voltage or potential which is present at a voltage division point 37 between the resistors 18 and 16 when the potential difference between the peak voltage 34 and a voltage 36 corresponding to the low level of the rectangular wave signal 33 is divided. On the other hand, when the voltage level of an input signal is the minimum voltage 38, a threshold voltage 39 is a voltage or potential which is present at the voltage division point 37 when the potential difference between the minimum voltage 38 and a voltage 41 corresponding to the high level of the rectangular wave signal 33 is divided. When the received optical signal has a maximum receiving level, the magnitude of $\Delta V_{TH}H$ becomes not less than 50 mV. Further, the magnitude of $\Delta V_{TH}L$ becomes just equal to 50 mV. Thus, sufficient margins for noises or the like can be secured.

Figure 6:
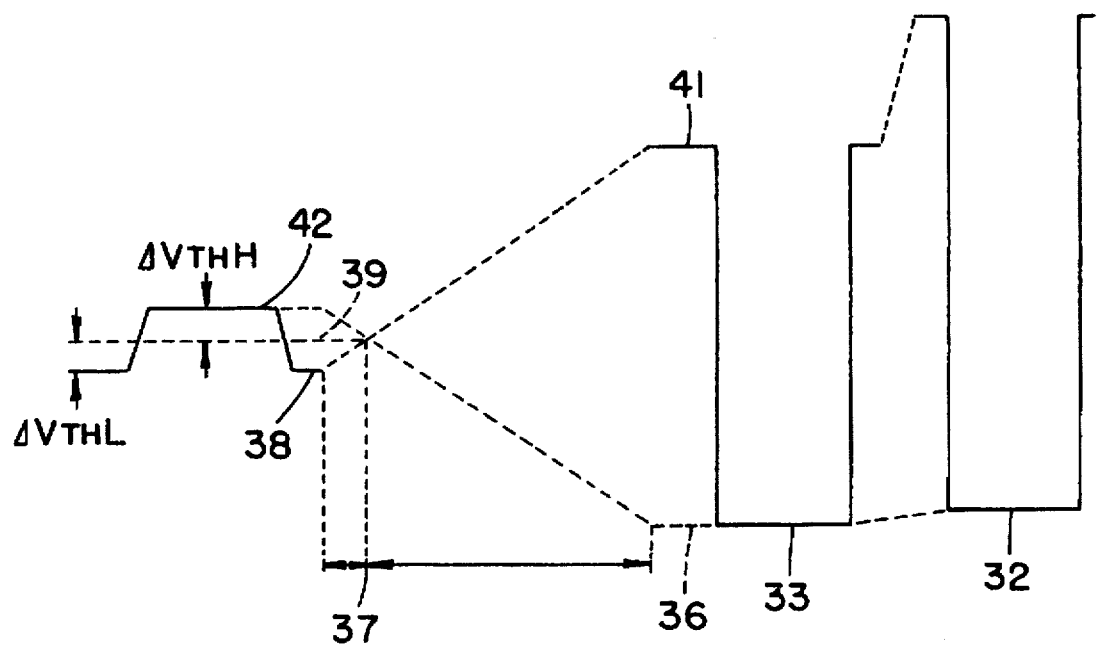
FIG. 6 is a waveform chart for illustrating waveforms of signals flowing through various parts of the light receiving circuit of FIG. 4 when this circuit receives an optical signal having a minimum receiving level.

FIG. 6 illustrates waveforms of signals flowing through various parts of this light receiving circuit when this circuit receives an optical signal having the minimum receiving level. In this figure, same reference character designates a same part of FIG. 5. A threshold voltage 39, which is used when the input signal has the minimum voltage level 38, is equal to the maximum receiving level. When the input signal comes to have a peak voltage 42 in the case where an optical signal having the minimum receiving level, the threshold voltage becomes equal to the minimum threshold voltage 39. Further, at that time, $\Delta V_{TH}H$ becomes equal to 50 mV which is equal to $\Delta V_{TH}L$. Thus, an output voltage of the comparator 11 is divided by the voltage dividing circuit 21 in such a manner that the mean value of the high level 41 and the low level 36 of the partial voltage is equal to the minimum threshold voltage 39. As a result, the magnitude of $\Delta V_{TH}H$ can be made to be equal to that of $\Delta V_{TH}L$. The minimum receiving level can be lowered to 1.3 V while securing necessary margins.

In the case of the aforementioned embodiment, the necessary magnitude of each of $\Delta V_{TH}L$ and $\Delta V_{TH}H$ at the time of using the minimum threshold voltage is set at 50 mV. The magnitude of each of $\Delta V_{TH}L$ and $\Delta V_{TH}H$, however, is not limited thereto. Further, in the case of this embodiment, as the intensity of light to be inputted becomes higher, the voltage level of the signal to be inputted to the comparator also becomes higher. In contrast with this, in the case of some light receiving circuit, an input voltage has the maximum voltage when no light is inputted thereto and further, the input voltage becomes lower as the intensity of light becomes higher. At that time, instead of grounding a terminal of the resistor 13, the terminal thereof should be connected to a constant voltage source for supplying a voltage of 5 V. When the output voltage of the comparator 11 has the high level, namely, is equal to almost 5 V, the voltage of almost 5 V is taken out as the partial voltage obtained by the voltage dividing circuit 21. In contrast, when the output voltage of the comparator 11 has a low level close to 0 V, the potential difference of 5 V is divided. Thus the partial voltage becomes higher than 0 V. Further, the mean value of the low level and the high level of the output voltage of the voltage dividing circuit 21 can be set at the minimum threshold voltage by appropriately setting a voltage dividing ratio.

Further, it is assumed that the comparator 11 is driven by using two power sources and that the high level of a source voltage is +5 V and the low level thereof is -5 V. At that time, if the minimum threshold voltage to be set is equal to or higher than 0 V, a constant power source for supplying a voltage of +5 V is connected to the resistor 13. In contrast, if the minimum threshold voltage to be set is lower than 0 V, a constant power source for supplying a voltage of -5 V is connected to the resistor 13. Thus, the mean value of the low level and the high level of the output voltage of the voltage dividing circuit 21 can be set at the minimum threshold voltage by appropriately setting the voltage dividing ratio thereof. Namely, the resistor 13 is driven by using one of the two voltages outputted by the comparator 11, which is closer to the minimum threshold voltage than the other thereof. Thereby, the mean value of the low level and the high level of the output voltage of the voltage dividing circuit 21 can be set at the minimum threshold voltage. Consequently, the minimum receiving level can be minimized by simultaneously securing the necessary magnitude of each of $\Delta V_{TH}L$ and $\Delta V_{TH}H$, regardless of the output and input voltages of the comparator 11.

Although the preferred embodiment of the present invention has been described above, it should be understood that the present invention is not limited thereto and that other modifications will be apparent to those skilled in the art without departing from the spirit of the invention.

The scope of the present invention, therefore, is to be determined solely by the appended claims.

What is claimed is:

1. A light receiving circuit comprising:
    photoelectric conversion means for outputting a voltage signal obtained according to intensity of a received optical signal;
    comparison means for inputting an output of the photoelectric conversion means from an inverting input terminal thereof, for outputting a high level signal having a predetermined voltage when a voltage applied to the inverting input terminal thereof is lower than a voltage applied to a non-inverting input terminal thereof, and for outputting a low level signal having a constant voltage lower than the predetermined voltage of the high level signal when the voltage applied to the inverting input terminal thereof is higher than the voltage applied to the non-inverting input terminal thereof;

voltage supply means for supplying a constant voltage nearly equal to one of the voltage of the high level signal and the voltage of the low level signal, which is closer to a predetermined threshold voltage to be applied to the non-inverting input terminal of the comparison means when the intensity of the optical signal increases;

first voltage dividing means for dividing a potential difference between an output voltage of the voltage supply means and an output voltage of the comparison means at a predetermined voltage division ratio and for decreasing a difference between a potential difference, which is caused between a partial voltage obtained as a result of the voltage division and the predetermined threshold voltage when a high level signal is outputted from the comparison means, and a potential difference which is caused therebetween when a low level signal is outputted from the comparison means; and second voltage dividing means for dividing a potential difference between a partial voltage outputted by the first voltage dividing means and a voltage applied to the inverting input terminal at a predetermined voltage division ratio and for supplying a threshold voltage to the non-inverting input terminal of the comparison means.

2. A light receiving circuit comprising:

photoelectric conversion means for outputting a voltage signal obtained according to intensity of a received optical signal;

comparison means for inputting an output of the photoelectric conversion means from an inverting input terminal thereof, for outputting a low level signal having a constant voltage nearly equal to grounding potential when a voltage applied to the inverting input terminal thereof is higher than a voltage applied to a non-inverting input terminal thereof, and for outputting a high level signal having a constant voltage, which is at least twice a predetermined threshold voltage higher than an offset voltage when the voltage applied to the inverting input terminal thereof is lower than the voltage applied to the non-inverting input terminal thereof;

first voltage dividing means for dividing a potential difference between an output voltage of the comparison means and the grounding potential at a predetermined voltage division ratio and for decreasing a difference between a potential difference, which is caused between a partial voltage obtained as a result of the voltage division and the predetermined threshold voltage when a high level signal is outputted from the comparison means, and a potential difference which is caused therebetween when a low level signal is outputted from the comparison means; and second voltage dividing means for dividing a potential difference between a partial voltage outputted by the first voltage dividing means and a voltage applied to the inverting input terminal at a predetermined voltage division ratio and for supplying a threshold voltage to the non-inverting input terminal of the comparison means.

3. The light receiving circuit according to claim 1, wherein the voltage division ratio of the first voltage dividing means is set in such a manner that the potential difference, which is caused between the partial voltage obtained as a result of the voltage division and the predetermined threshold voltage when the high level signal is outputted from the comparison means, is equal to the potential difference which is caused therebetween when the low level signal is outputted from the comparison means.

4. The light receiving circuit according to claim 1, wherein the voltage division ratio of the second voltage dividing means is set in such a manner that when the intensity of the received optical signal is minimum, a partial voltage outputted by the second voltage dividing means becomes equal to the predetermined threshold voltage.

* * * * *